United States Patent
Ho et al.

(10) Patent No.: US 8,975,755 B2
(45) Date of Patent: Mar. 10, 2015

(54) CHIP PACKAGE

(71) Applicant: Xintec Inc., Jhongli, Taoyuan County (TW)

(72) Inventors: Yen-Shih Ho, Kaohsiung (TW); Tsang-Yu Liu, Zhubei (TW); Chia-Sheng Lin, Zhongli (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 14/171,734

(22) Filed: Feb. 3, 2014

(65) Prior Publication Data

US 2014/0225276 A1    Aug. 14, 2014

Related U.S. Application Data

(60) Provisional application No. 61/762,508, filed on Feb. 8, 2013.

(51) Int. Cl.
*H01L 23/48* (2006.01)
*H01L 23/52* (2006.01)
*H01L 29/40* (2006.01)

(52) U.S. Cl.
CPC ............ *H01L 23/481* (2013.01); *H01L 2224/16* (2013.01); *H01L 2224/48091* (2013.01)
USPC .............. 257/777; 257/E21.614; 257/686; 257/723; 438/108; 361/760

(58) Field of Classification Search
CPC ................. H01L 25/0657; H01L 2924/01079; H01L 2224/48091
USPC .......... 257/E21.614, 685, 686, 723, 774, 777; 438/108, 109; 361/760
See application file for complete search history.

(56) References Cited

U.S. PATENT DOCUMENTS

| | | | |
|---|---|---|---|
| 5,714,800 A * | 2/1998 | Thompson | 257/690 |
| 6,747,348 B2 * | 6/2004 | Jeung et al. | 257/686 |
| 6,750,547 B2 * | 6/2004 | Jeung et al. | 257/778 |
| 7,211,885 B2 * | 5/2007 | Nordal et | 257/686 |
| 7,310,239 B1 * | 12/2007 | Fjelstad et al. | 361/764 |
| 7,595,222 B2 * | 9/2009 | Shimoishizaka et al. | 438/107 |
| 8,198,136 B2 * | 6/2012 | Oh | 438/109 |
| 8,258,607 B2 * | 9/2012 | Wheless et al. | 257/666 |
| 8,558,392 B2 * | 10/2013 | Chua et al. | 257/777 |
| 8,704,288 B2 * | 4/2014 | Lee et al. | 257/316 |

* cited by examiner

*Primary Examiner* — Chris Chu
(74) *Attorney, Agent, or Firm* — Liu & Liu

(57) ABSTRACT

An embodiment of the disclosure provides a chip package which includes: a semiconductor substrate having a first surface and a second surface; a first recess extending from the first surface towards the second surface; a second recess extending from a bottom of the first recess towards the second surface, wherein a sidewall and the bottom of the first recess and a second sidewall and a second bottom of the second recess together form an exterior side surface of the semiconductor substrate; a wire layer disposed on the first surface and extending into the first recess and/or the second recess; an insulating layer located between the wire layer and the semiconductor substrate; a chip disposed on the first surface; and a conducting structure disposed between the chip and the first surface.

20 Claims, 4 Drawing Sheets

CHIP PACKAGE

CROSS REFERENCE TO RELATED APPLICATIONS

This Application claims the benefit of U.S. Provisional Application No. 61/762,508 filed on Feb. 8, 2013, the entirety of which is incorporated by reference herein.

BACKGROUND

1. Field of the Disclosure

The disclosure relates to a chip package and methods for forming the same, and in particular to a chip package formed by a wafer-level packaging process.

2. Description of the Related Art

A packaging process of chip packages is one important step in forming electronic products. A chip package not only provides protection for the chips from environmental contaminants, but also provides a connection interface for internal electronic elements and chips packaged therein.

Because demands to reduce the size of electronic products continue, it has become an important issue to dispose more conducting wires in a limited space.

BRIEF SUMMARY OF THE DISCLOSURE

An embodiment of the disclosure provides a chip package comprising a semiconductor substrate having a first surface and a second surface; a first recess extending from the first surface towards the second surface; a second recess extending from a bottom of the first recess towards the second surface, wherein a sidewall and the bottom of the first recess and a second sidewall and a second bottom of the second recess together form an exterior side surface of the semiconductor substrate; a wire layer disposed over the first surface and extending into the first recess and/or the second recess; an insulating layer positioned between the wire layer and the semiconductor substrate; a chip disposed over the first surface; and a conducting structure disposed between the chip and the first surface.

An embodiment of the disclosure provides a chip package comprising a semiconductor substrate having a first surface and a second surface; a plurality of recesses extending from the first surface towards the second surface and connecting with each other, wherein sidewalls and bottoms of the recesses together form an exterior side surface of the semiconductor substrate; a wire layer disposed over the first surface and extending into at least one of the recesses; an insulating layer positioned between the wire layer and the semiconductor substrate; a chip disposed over the first surface; and a conducting structure disposed between the chip and the first surface.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

Figure 1:
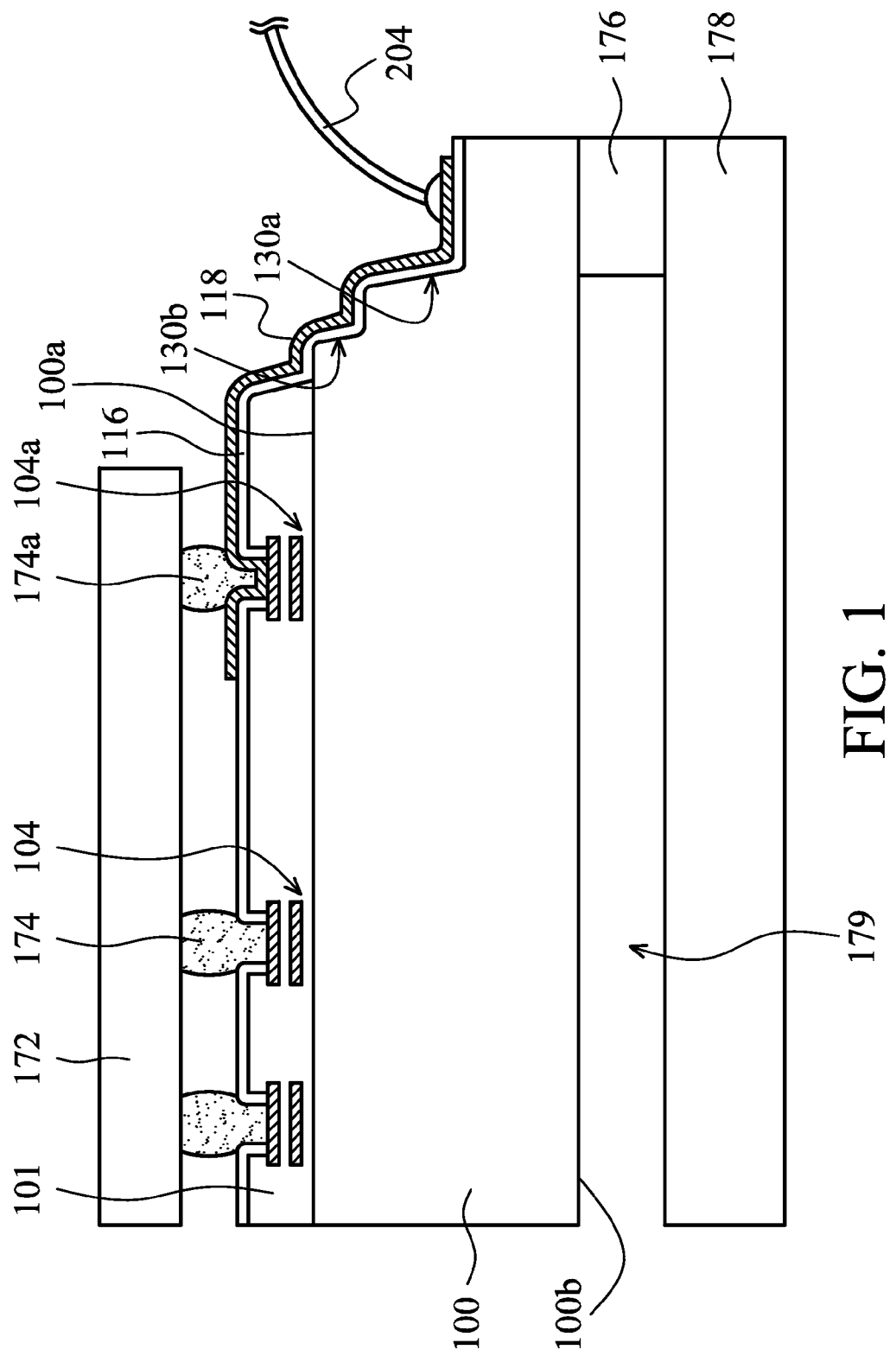
FIG. 1 is a cross-sectional view of a chip package according to an embodiment of the present disclosure.

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

A chip package according to an embodiment of the present disclosure may be used to package a variety of chips. For example, the chip package of the embodiments of the disclosure may be applied to active or passive devices, or electronic components with digital or analog circuits, such as optoelectronic devices, micro-electromechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

FIG. 1 is a cross-sectional view of a chip package according to an embodiment of the present disclosure. The chip package may include a semiconductor substrate 100 which has a surface 100a and a surface 100b. The semiconductor substrate 100 may include (but is not limited to) a silicon substrate, a silicon germanium substrate, or a combination thereof. In one embodiment, the semiconductor substrate 100 may be a semiconductor chip. For example, the semiconductor substrate 100 may be an image sensor chip having an image detecting region (not shown) formed therein, which is formed, for example, in the semiconductor substrate 100 and close to the surface 100a.

A dielectric layer 101 may be optionally formed over the surface 100a of the semiconductor substrate 100. A plurality of conducting pads, such as a conducting pad 104 and a conducting pad 104a, may be formed in the dielectric layer 101. Each of the conducting pad 104 or the conducting pad 104a may include a stack of multiple conducting layers. The conducting layers of the stack may be electrically connected to each other through conducting paths (not shown) therebetween. In one embodiment, the conducting pad 104 or the conducting pad 104a may be electrically connected to electronic elements in a device region (such as an image detecting region) of the semiconductor substrate 100 through conducting paths (not shown) in the dielectric layer 101 and/or the semiconductor substrate 100. The dielectric layer 101 may have openings which expose the conducting pad 104 and the conducting pad 104a. The material of the dielectric layer 101 may include (but is not limited to) silicon oxide, silicon nitride, silicon oxynitride, or a combination thereof.

In one embodiment, through a patterning process and/or a dicing process, the semiconductor substrate 100 may have a plurality of recesses. These recesses may extend from the surface 100a towards the surface 100b and connect with each other. In addition, sidewalls and bottoms of these recesses may together form an exterior side surface of the semiconductor substrate 100. That is, a portion of the exterior side surface of the semiconductor substrate 100 is together constructed by the sidewalls and the bottoms of the recesses. In the embodiment shown in FIG. 1, two recesses 130b and 130a are taken as an example for illustration. However, it should be appreciated that in another embodiment, the semiconductor substrate 100 may have three or more than three recesses connecting with each other, and the bottoms and the sidewalls of these recesses may together form the exterior side surface of the semiconductor substrate.

As shown in FIG. 1, the recess 130b may extend from the surface 100a towards the surface 100b of the semiconductor substrate 100. The recess 130a may extend from the bottom of the recess 130b towards the surface 100b. The sidewall and the bottom of the recess 130b and the sidewall and the bottom of the recess 130a may together form an exterior side surface of the semiconductor substrate 100.

An insulating layer 116 may be formed over the surface 100a of the semiconductor substrate 100. The insulating layer 116 may extend into the recess 130b and the recess 130a. In one embodiment, the insulating layer 116 may be conformally formed on the sidewalls and the bottoms of the recess 130b and the recess 130a. The material of the insulating layer 116 may include (but is not limited to) silicon oxide, silicon nitride, silicon oxynitride, a polymer material, other suitable insulating materials, or a combination thereof. The insulating layer 116 may have openings which expose the conducting pads 104 and 104a.

A plurality of wire layers may be formed over the insulating layer 116 over the surface 100a of the semiconductor substrate 100, which include a wire layer 118. The material of the wire layer 118 may include (but is not limited to) copper, aluminum, gold, platinum, nickel, tin, silver, or a combination thereof. The wire layer 118 may extend into the recess 130b and/or the recess 130a. For example, in one embodiment, the wire layer 118 may extend over the sidewall and the bottom of the recess 130b and further extend over the sidewall and the bottom of the recess 130a, as shown in FIG. 1. Alternatively, the wire layer 118 may extend only into the recess 130b. In one embodiment, the wire layer 118 may be electrically connected to the conducting pad 104a. In one embodiment, a solder wire 204 may be optionally formed. The solder wire 204 may electrically contact the wire layer 118 extending into the recess 130b and/or the recess 130a. In one embodiment, the solder wire 204 may be in direct contact with the wire layer 118 directly over a bottom of a lowest recess (such as the recess 130a) of these recesses which is closest to the surface 100b. The solder wire 204 may be used to allow electrical signals of another electronic element (such as a printed circuit board) to be transmitted to the chip package through the wire layer 118.

A chip 172 may be disposed over the surface 100a of the semiconductor substrate 100. Conducting structures (such as a conducting structure 174 or a conducting structure 174a) disposed between the chip 172 and the surface 100a of the semiconductor substrate 100 may be used to transmit electrical signals between the semiconductor substrate 100 and the chip 172. The conducting structure 174 and the conducting structure 174a may be, for example, (but is not limited to) conducting bumps, solder balls, or other similar structures.

In one embodiment, the wire layer 118 may be electrically connected to the conducting structure 174a. In this case, the electrical signals may not only be transmitted between the chip 172 and the semiconductor substrate 100 through the conducting structure 174a, but also be transmitted between another electronic element through the wire layer 118 and the solder wire 204 formed in the recess 130a or the recess 130b. In addition, the conducting structure 174 may also be in direct contact with the conducting pad 104 such that electrical signals are transmitted between the chip 172 and the semiconductor substrate 100. In one embodiment, the chip 172 may be a signal processing chip, and the semiconductor substrate 100 may be an image sensor chip including image detecting regions (not shown).

Figure 2:
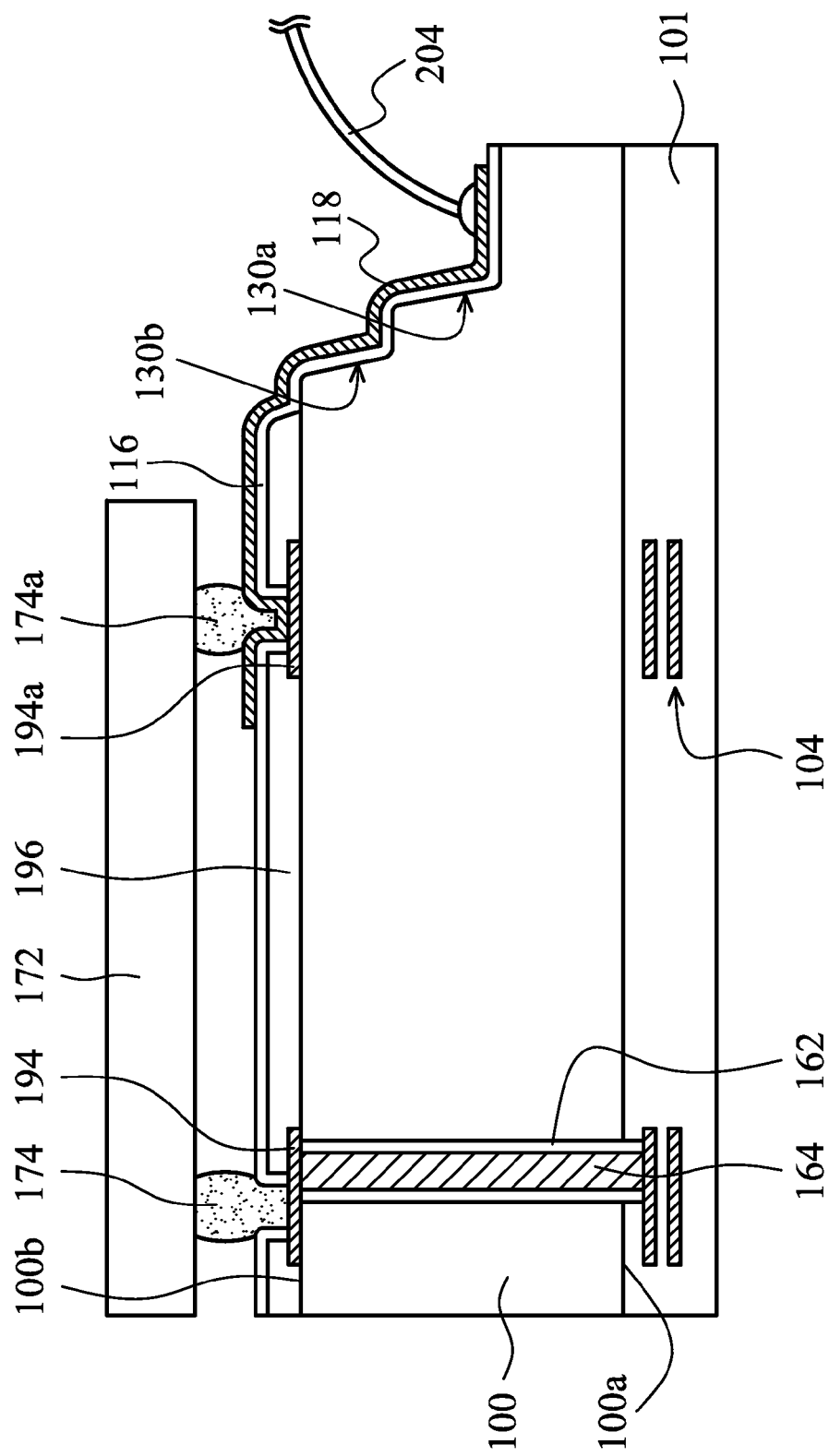
FIG. 2 is a cross-sectional view of a chip package according to an embodiment of the present disclosure.

In one embodiment, the chip package may optionally include a carrier substrate 178. The carrier substrate 178 may be disposed over the surface 100b of the semiconductor substrate 100. A spacer layer 176 may be optionally disposed between the carrier substrate 178 and the semiconductor substrate 100. The spacer layer 176, the carrier substrate 178, and the semiconductor substrate 100 may together surround a substantially closed cavity 179. In one embodiment, the carrier substrate 178 may include a transparent substrate such as (but not limited to) a glass substrate, a quartz substrate, a sapphire substrate, a transparent polymer substrate, or a combination thereof. The material of the spacer layer 176 may include (but is not limited to) a polymer material, a metal material, a ceramic material, a semiconductor material, or a combination thereof FIG. 2 is a cross-sectional view of a chip package according to an embodiment of the present disclosure, wherein the same or similar reference numbers are used to designate the same or similar elements. In this embodiment, the recess 130b extends from the surface 100b towards the surface 100a of the semiconductor substrate 100, and the recess 130a extends from the bottom of the recess 130b towards the surface 100a. In this embodiment, a conducting pad 194 and a conducting pad 194a are disposed over the surface 100b of the semiconductor substrate 100. A protection layer 196 may cover the surface 100b of the semiconductor substrate 100 and have openings which expose the conducting pad 194 and the conducting pad 194a. The conducting pad 194 may be electrically connected to the conducting pad 104 over the surface 100a through a through-substrate conducting structure 164 formed in the semiconductor substrate 100. An insulating layer 162 may be formed between the through-substrate conducting structure 164 and the semiconductor substrate 100. The material of the through-substrate conducting structure 164 may include (but is not limited to) copper, aluminum, gold, platinum, tin, nickel, or a combination thereof. The material of the insulating layer 162 may include (but is not limited to) silicon oxide, silicon nitride, silicon oxynitride, a polymer material, or a combination thereof.

Through the conducting structure 174 disposed thereunder, the chip 172 may transmit electrical signals to the semiconductor substrate 100 or receive electrical signals from the semiconductor substrate 100. In addition, the conducting structure 174a may be electrically connected to the wire layer 118, and the wire layer 118 may be electrically connected to the conducting pad 194a and be electrically connected to the solder layer 204 in the recess. In this embodiment, the wire layer 118 is not electrically connected to the through-substrate conducting structure 164.

Figure 3:
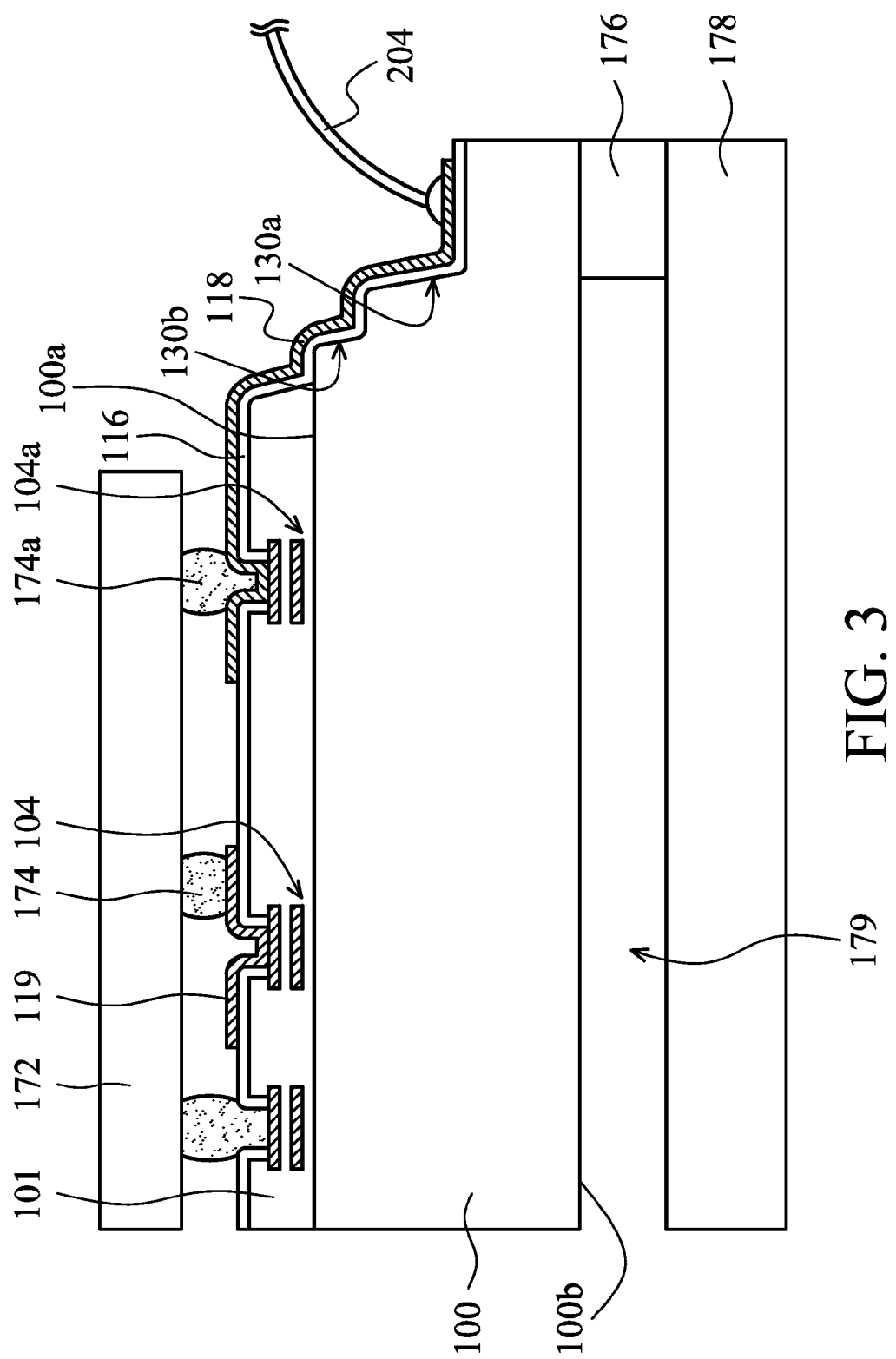
FIG. 3 is a cross-sectional view of a chip package according to an embodiment of the present disclosure.

FIG. 3 is a cross-sectional view of a chip package according to an embodiment of the present disclosure, wherein the same or similar reference numbers are used to designate the same or similar elements. The structure shown in FIG. 3 is similar to the structure shown in FIG. 1. The main difference is that the structure shown in FIG. 3 further includes a redistribution layer 119. The redistribution layer 119 may be formed over the insulating layer 116. The material of the redistribution layer may include (but is not limited to) copper, aluminum, gold, platinum, tin, nickel, or a combination thereof. In one embodiment, the redistribution layer 119 and the wire layer 118 may be patterned from the same conducting layer. Therefore, the redistribution layer 119 and the wire layer 118 may be simultaneously formed and have the same material. The redistribution layer 119 may be used to be electrically connected to the conducting structure 174 under the chip 172. In one embodiment, the redistribution layer 119 may extend into the recess of the semiconductor substrate 100. For example, the redistribution layer 119 may also extend into the recess 130a and electrically contact the solder wire 204. Alternatively, the redistribution layer 119 extending into the recess 130a may not electrically contact the solder wire 204, but may be electrically connected to other conducting structures or other solder wires.

Figure 4:
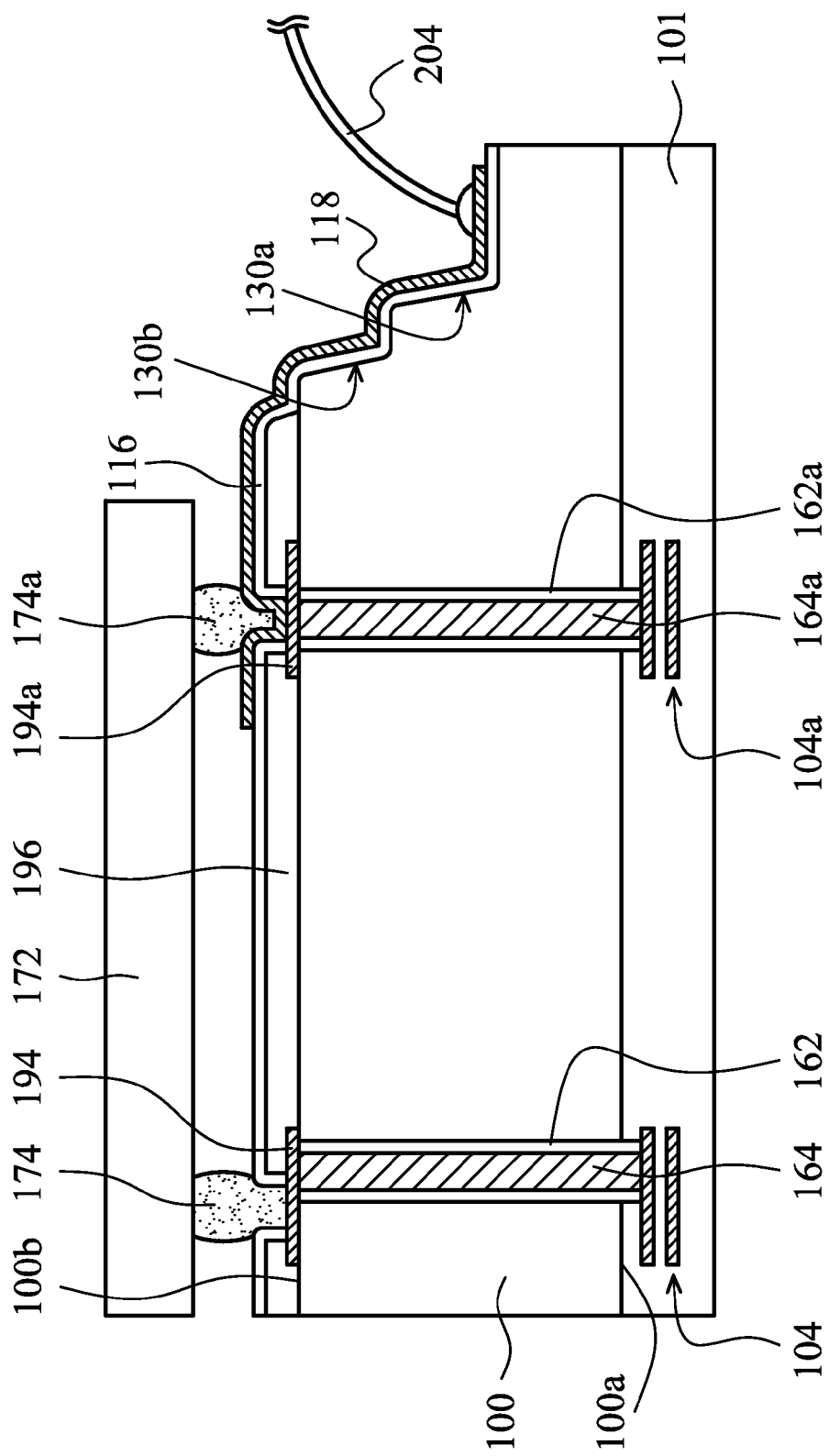
FIG. 4 is a cross-sectional view of a chip package according to an embodiment of the present disclosure.

FIG. 4 is a cross-sectional view of a chip package according to an embodiment of the present disclosure, wherein the same or similar reference numbers are used to designate the same or similar elements. The structure shown in FIG. 4 is similar to the structure shown in FIG. 2. The main difference is that the structure shown in FIG. 4 further includes a through-substrate conducting structure 164a. The through-substrate conducting structure 164a is electrically connected to the conducting pad 104a and the conducting pad 194a. In addition, the wire layer 118 is electrically connected to the conducting pad 194a, the conducting structure 174a, and the solder wire 204.

In the embodiments of the disclosure, through stacking chips and leading a wire layer into a recess, more conducting paths may be disposed in a limited space, which assists in the size reduction of the chip package. Because the transmittance distance of the wire layer is reduced, the transmittance speed of signals may be improved. In addition, because a solder wire is formed in the recess, the solder wire may be protected by the recess such that the reliability of the chip package is improved. Because the solder wire is formed in the recess, the overall size of the chip package may be reduced. According to the embodiments of the disclosure, the recesses include a plurality of recesses which connect with each other such that the wire layer is deposited over a smoother profile. The reliability of the wire layer may be improved.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a semiconductor substrate having a first surface and a second surface;
    a first recess extending from the first surface towards the second surface;
    a second recess extending from a bottom of the first recess towards the second surface, wherein a sidewall and the bottom of the first recess and a second sidewall and a second bottom of the second recess together form an exterior side surface of the semiconductor substrate;
    a wire layer disposed over the first surface and extending into the first recess and/or the second recess;
    an insulating layer positioned between the wire layer and the semiconductor substrate;
    a chip disposed over the first surface; and
    a conducting structure disposed between the chip and the first surface.

2. The chip package as claimed in claim 1, further comprising:
    a dielectric layer positioned between the first surface and the insulating layer; and
    a first conducting pad positioned in the dielectric layer, wherein the wire layer is electrically connected to the first conducting pad.

3. The chip package as claimed in claim 2, wherein the wire layer is electrically connected to the conducting structure.

4. The chip package as claimed in claim 2, further comprising:
    a second conducting pad positioned in the dielectric layer; and
    a second conducting structure disposed between the chip and the first surface and electrically connected to the second conducting pad.

5. The chip package as claimed in claim 4, wherein the second conducting structure is electrically connected to the second conducting pad through a redistribution layer.

6. The chip package as claimed in claim 1, wherein the semiconductor substrate is a semiconductor chip.

7. The chip package as claimed in claim 6, wherein the semiconductor chip is an image sensor chip, and the chip is a signal processing chip.

8. The chip package as claimed in claim 1, wherein the wire layer extends over the second bottom of the second recess.

9. The chip package as claimed in claim 1, further comprising a solder wire electrically contacting the wire layer extending into the first recess and/or the second recess.

10. The chip package as claimed in claim 1, further comprising a carrier substrate disposed over the second surface.

11. The chip package as claimed in claim 10, further comprising a spacer layer disposed between the carrier substrate and the semiconductor substrate, wherein the spacer layer, the carrier substrate, and the semiconductor substrate together surround a substantially closed cavity.

12. The chip package as claimed in claim 10, wherein the carrier substrate is a transparent substrate.

13. The chip package as claimed in claim 1, further comprising:
- a dielectric layer positioned over the second surface;
- a conducting pad positioned in the dielectric layer;
- a through-substrate conducting structure penetrating through the first surface and the second surface and electrically connected to the conducting pad and the conducting structure; and
- a second insulating layer positioned between the through-substrate conducting structure and the semiconductor substrate.

14. The chip package as claimed in claim 13, wherein the wire layer is electrically connected to the through-substrate conducting structure.

15. The chip package as claimed in claim 13, wherein the wire layer is not electrically connected to the through-substrate conducting structure.

16. The chip package as claimed in claim 13, further comprising:
- a second conducting pad positioned in the dielectric layer;
- a second conducting structure disposed between the chip and the first surface;
- a second through-substrate conducting structure penetrating through the first surface and the second surface and electrically connected to the second conducting pad and the second conducting structure; and
- a third insulating layer positioned between the second through-substrate conducting structure and the semiconductor substrate.

17. A chip package comprising:
- a semiconductor substrate having a first surface and a second surface;
- a plurality of recesses extending from the first surface towards the second surface and connecting with each other, wherein sidewalls and bottoms of the recesses together form an exterior side surface of the semiconductor substrate;
- a wire layer disposed over the first surface and extending into at least one of the recesses;
- an insulating layer positioned between the wire layer and the semiconductor substrate;
- a chip disposed over the first surface; and
- a conducting structure disposed between the chip and the first surface.

18. The chip package as claimed in claim 17, further comprising a solder wire electrically contacting the wire layer extending into at least one of the recesses.

19. The chip package as claimed in claim 18, further comprising a solder wire, wherein the solder wire is in direct contact with the wire layer directly over a bottom of a lowest recess of the recesses which is closest to the second surface.

20. The chip package as claimed in claim 19, wherein the bottom of the lowest recess is substantially parallel to the second surface.

\* \* \* \* \*